United States Patent
Anand et al.

[19]

[11] Patent Number: 5,978,281

[45] Date of Patent: Nov. 2, 1999

[54] METHOD AND APPARATUS FOR PREVENTING POSTAMBLE CORRUPTION WITHIN A MEMORY SYSTEM

[75] Inventors: Darren L. Anand, Essex Junction; Robert Tamlyn, Jericho, both of Vt.

[73] Assignee: International Business Machines Corporation, Armonk, N.Y.

[21] Appl. No.: 09/225,535

[22] Filed: Jan. 4, 1999

[51] Int. Cl.[6] .................................................. G11C 7/00
[52] U.S. Cl. ................. 365/189.05; 365/233; 365/233.5
[58] Field of Search ........................... 365/189.05, 233.5, 365/189.12, 233

[56] References Cited

U.S. PATENT DOCUMENTS

| | | | |
|---|---|---|---|
| 5,124,584 | 6/1992 | McClure | 365/230.08 |
| 5,306,963 | 4/1994 | Leak et al. | 365/233.5 |
| 5,553,033 | 9/1996 | McAdams | 365/233.5 |
| 5,606,269 | 2/1997 | Pontius et al. | 365/233.5 |
| 5,636,177 | 6/1997 | Fu | 365/233.5 |
| 5,682,496 | 10/1997 | Roohparvar | 395/430 |
| 5,768,212 | 6/1998 | Fujita | 365/189.05 |
| 5,777,928 | 7/1998 | Vidwans et al. | 365/189.05 |

*Primary Examiner*—Vu A. Le
*Attorney, Agent, or Firm*—Dugan & Dugan; Robert A. Walsh

[57] ABSTRACT

A postamble corruption protection circuit is provided that disables data latching by a first falling edge register following a data strobe (DQS) falling edge until the data within the first falling edge register has been latched into a second falling edge register in response to a second falling edge register latching signal. Specifically, data latching by the first falling edge register is disabled following each DQS falling edge and is enabled following each second falling edge register latching signal. Data latching of the first falling edge register is controlled by the output of a set/reset register which is gated with the DQS to form a first falling edge register latching signal. When the set/reset register is set, data latching is enabled and when the set/reset register is reset, data latching is disabled. The set/reset register is set in response to a second falling edge register latching signal and is reset in response to a DQS falling edge.

17 Claims, 4 Drawing Sheets

METHOD AND APPARATUS FOR PREVENTING POSTAMBLE CORRUPTION WITHIN A MEMORY SYSTEM

FIELD OF THE INVENTION

The present invention relates to memory systems and more specifically to a method and apparatus for preventing postamble corruption within a memory system.

BACKGROUND OF THE INVENTION

The data transfer speed between memory chips and controller chips has significantly increased with the introduction of double data rate (DDR) memory chips. To achieve this speed increase, DDR memory chips employ a data strobe (DQS) signal which allows data to be latched from a data bus by a receiver (e.g., a memory chip, or a controller chip that controls the memory chip) on both the rising and the falling edge of the DQS. Specifically, during data transfer, data and the DQS are driven from a source (e.g., a controller chip during a "write" operation or a memory chip during a "read" operation) to a receiver (e.g., a memory chip during a write operation or a controller chip during a we read operation). The receiver latches one bit of data into a first rising edge register in response to each DQS rising edge, and latches one bit of data into a first falling edge register in response to each DQS falling edge. As used herein, "in response to" means in direct response to a signal, in response to the inverse of the signal or in response to a combination of the signal with one or more other signals.

Once a data bit has been latched by the receiver, the data bit is synchronized to the receiver's internal clock. To achieve data bit synchronization, between each successive DQS rising edge, the data bit stored within the first rising edge register is latched into a second rising edge register in response to the receiver's internal clock. Similarly, between each DQS falling edge, the data bit stored within the first falling edge register is latched into a second falling edge register in response to the receiver's internal clock. Data synchronization of both rising and falling edge data thereby is achieved.

Following data transfer, a source and its associated receiver may wish to reverse roles (e.g., a controller chip may wish to switch from a read operation to a write operation or vice versa), or a controller chip presently controlling a data bus may wish to relinquish the data bus to another controller. To switch between read and write operations, or to relinquish control of a data bus, following the last falling edge of the DQS, the source holds the DQS at a low voltage level for one half of a clock cycle (i.e., the postamble) and then "releases" the DQS to a floating state. Thereafter, another chip may drive the DQS.

Once released, the DQS may float to any voltage level. In many instances the released DQS oscillates and generates unintended DQS rising and falling edge transitions. Because the last "intentional" DQS transition is always a falling edge transition (which occurs immediately preceding the postamble and which latches the last transferred data bit into the first falling edge register), an unintended DQS falling edge immediately following the postamble can latch corrupt data into the first falling edge register before the last transferred data bit stored therein is latched into the second falling edge register. Corrupt data, instead, is latched into the second falling edge register in response to the receiver's internal clock. This form of data corruption ("postamble corruption") can occur following each postamble and is a serious drawback to the significant speed gains associated with DDR memory chips.

One solution to postamble corruption is to extend the postamble time period to a full clock cycle. A full clock cycle postamble guarantees that the last data bit stored within the first falling edge register is transferred to the second falling edge register before the DQS is released. This solution, however, has been rejected by DDR manufacturers because a longer postamble increases the time required to switch between read and write operations and thus decreases overall memory system throughput.

Accordingly, a need exists for a method and apparatus for preventing postamble corruption within a memory system. Such a method and apparatus will greatly advance the benefits of DDR memory chips by providing postamble corruption free data transfer.

SUMMARY OF THE INVENTION

To address the needs of the prior art, a postamble corruption protection circuit is provided that disables data latching by the first falling edge register following a DQS falling edge until the data within the first falling edge register has been latched into the second falling edge register in response to a second falling edge register latching signal (e.g., the receiver's internal clock). Specifically, data latching by the first falling edge register is disabled following each falling edge of the DQS and is enabled following each second falling edge register latching signal. By disabling data latching by the first falling edge register following each DQS falling edge, the postamble corruption protection circuit need not know when the postamble will occur, and data streams of arbitrary length may be transferred free of postamble corruption.

Data latching of the first falling edge register is controlled by an output signal (i.e., DQS enable) of a set/reset register. The DQS enable is gated with the DQS to form a latching signal (i.e., DQS fixed) that latches the first falling edge register. When the set/reset register is set, data latching by the first falling edge register is enabled, and when the set/reset register is reset, data latching by the first falling edge register is disabled.

The set/reset register is set in response to a second falling edge register latching signal and is reset in response to a DQS falling edge. Latching of the first falling edge register, therefore, is disabled following each DQS falling edge, and arbitrary length data streams may be transferred free of postamble corruption.

A significant advantage of the present invention is that postamble corruption is prevented without extending the postamble time period. Corruption protection thereby is provided without sacrificing memory system performance. Further, the postamble corruption protection circuit may be employed within both a controller chip and a memory chip to provide postamble corruption protection during both read and write operations.

Other objects, features and advantages of the present invention will become more fully apparent from the following detailed description of the preferred embodiments, the appended claims and the accompanying drawings.

BRIEF DESCRIPTION OF THE DRAWINGS

The present invention is described with reference to the accompanying drawings. In the drawings, like reference numbers indicate identical or functionally similar elements. Additionally, the left-most digit of a reference number identifies the drawing in which the reference number first appears.

DETAILED DESCRIPTION OF THE PREFERRED EMBODIMENTS

Figure 1:
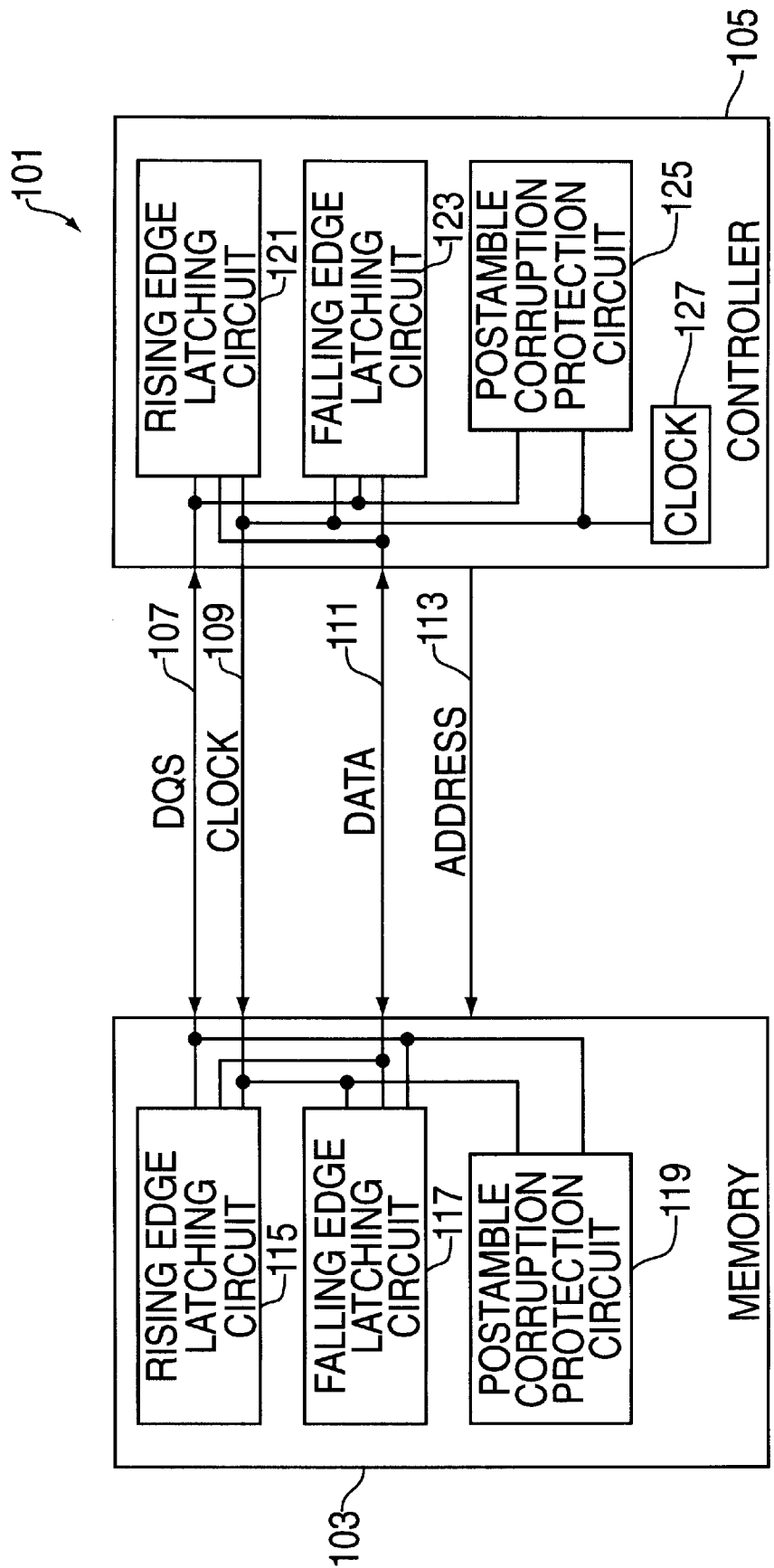
FIG. 1 is a block diagram of a DDR memory system employing the postamble corruption protection circuit of the present invention.

FIG. 1 is a block diagram of a DDR memory system 101 employing postamble corruption protection circuitry in accordance with the present invention. The DDR memory system 101 comprises a DDR memory chip 103 coupled (i.e., directly or indirectly coupled so as to operate) to a controller chip 105 via a data strobe (DQS) line 107, a clock line 109, a data bus 111 and an address bus 113. The DQS line 107 and the data bus 111 are bi-directional, and the clock line 109 and the address bus 113 are one directional and are controlled by the controller chip 105.

The memory chip 103 comprises in pertinent part a rising edge latching circuit 115 and a falling edge latching circuit 117 both coupled to the DQS line 107, to the clock line 109 and to the data bus 111. The memory chip 103 also comprises a postamble corruption protection circuit 119 coupled to the falling edge latching circuit 117, to the DQS line 107 and to the clock line 109. For clarity only one rising edge latching circuit and one falling edge latching circuit are shown. In practice, a rising edge latching circuit and a falling edge latching circuit are required for each data line within the data bus 111, and the postamble corruption protection circuit 119 is coupled to each falling edge latching circuit.

The controller chip 105 similarly comprises in pertinent part a rising edge latching circuit 121 and a falling edge latching circuit 123 both coupled to the DQS line 107 and to the data bus 111. The controller chip 105 also comprises a postamble corruption protection circuit 125 coupled to the falling edge latching circuit 123 and to the DQS line 107. Unlike the DDR memory chip 103, the controller chip 105 comprises an internal clock 127 which couples and supplies a clock signal (CLK) to the clock line 109, to the rising edge latching circuit 121, to the falling edge latching circuit 123 and to the postamble corruption protection circuit 125. The controller chip 105 also supplies the CLK (via the clock line 109) to the rising edge latching circuit 115, to the falling edge latching circuit 117 and to the postamble corruption protection circuit 119 of the DDR memory chip 103. Because the postamble corruption protection circuit 119 of the DDR memory chip 103 and the postamble corruption protection circuit 125 of the controller chip 105 function similarly, only the operation of the postamble corruption protection circuit 119 of the DDR memory chip 103 (e.g., during a "write" operation between the controller chip 105 and the DDR memory chip 103) is described herein.

During a write operation, the controller chip 105 issues a write command to the DDR memory chip 103 via control line (not shown). Thereafter, the controller chip 105 sends (via the address bus 113) the address location where data is to be stored within the DDR memory chip 103, the data (via the data bus 111) to be stored by the DDR memory chip 103, and the DQS via the DQS line 107. The CLK generated by the internal clock 127 is continuously supplied to the DDR memory chip 103 via the clock line 109. The DQS, the CLK and the data to be stored (e.g., a data bit stream from one data line of the data bus 111) are supplied to the rising edge latching circuit 115 and to the falling edge latching circuit 117, and the DQS and the CLK are supplied to the postamble corruption protection circuit 119.

For clarity, the DQS, the CLK and the data external to the DDR memory chip 103 (e.g., prior to entering the DDR memory chip 103) are represented as the XDQS, the XCLK and the Xdata, respectively, in FIGS. 2–4 below. The DQS, the CLK and the data internal to the DDR memory chip 103 are represented as the IDQS, the ICLK and the Idata, respectively. An inverted signal is preceded by an exclamation point (e.g., !IDQS represents the inverse of the DQS that is internal to the DDR memory chip 103).

In response to each rising edge of the DQS, the rising edge latching circuit 115 latches one data bit from the data bus 111. Similarly, in response to each falling edge of the DQS, the falling edge latching circuit 117 latches one data bit from the data bus 111. Data latching by the rising edge latching circuit 115 and the falling edge latching circuit 117 is continued until all data has been transferred from the controller chip 105 to the DDR memory chip 103. As described below with reference to FIGS. 2–4, the postamble corruption protection circuit 119 selectively enables and disables latching of the falling edge latching circuit 117 by the DQS so as to prevent postamble corruption following completion of the write command.

To understand the operation of the postamble corruption protection circuit 119 it is first necessary to understand the operation of the DDR memory chip 103 absent the postamble corruption protection circuit 119. Accordingly, FIG. 2 is a schematic diagram of the rising edge latching circuit 115 and the falling edge latching circuit 117 of the DDR memory chip 103 of FIG. 1 absent the postamble corruption protection circuit 119, and FIG. 3 is a schematic diagram of the rising edge latching circuit 115 and the falling edge latching circuit 117 of the DDR memory chip 103 of FIG. 1 having the postamble corruption protection circuit 119 coupled thereto.

Figure 2:
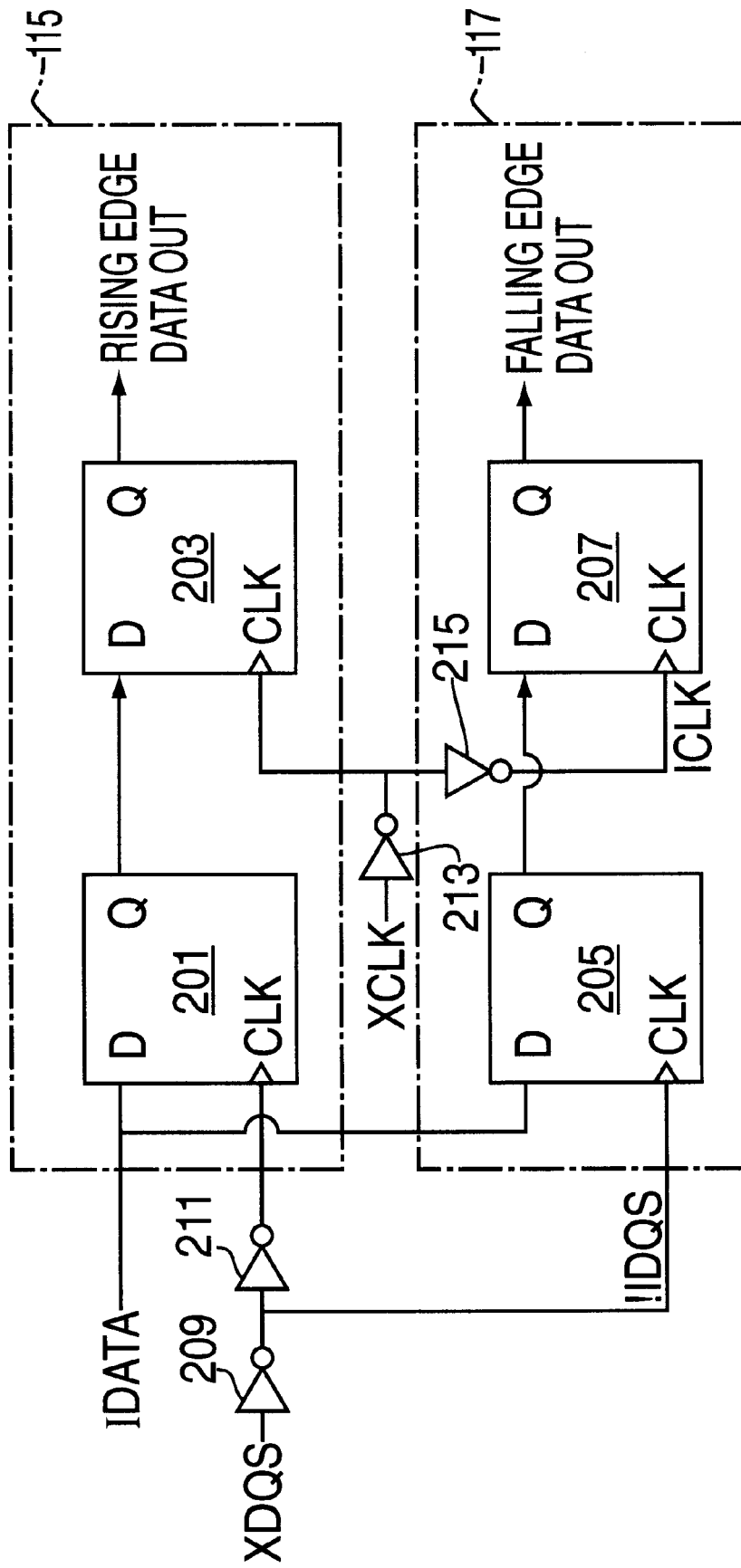
FIG. 2 is a schematic diagram of the rising edge latching circuit and falling edge latching circuit of the DDR memory chip of FIG. 1 absent the inventive postamble corruption protection circuit.

With reference to FIG. 2, the rising edge latching circuit 115 comprises a first rising edge register 201 (e.g., a D-type latch) coupled to a second rising edge register 203. The falling edge latching circuit 117 comprises a first falling edge register 205 coupled to a second falling edge register 207. Each register 201–207 has an input (D), an output (Q) and a latching signal input (CLK) for latching data from the register's input (D) to the register's output (Q) in response to a latching signal present on the register's latching signal input (CLK). The input (D) of the first rising edge register 201 and the input (D) of the first falling edge register 205 are coupled to the data bus 111 and both receive data therefrom (e.g., Idata). The output (Q) of the first rising edge register 201 is coupled to the input (D) of the second rising edge register 203, and the output (Q) of the first falling edge register 205 is coupled to the input (D) of the second falling edge register 207.

The latching signal input (CLK) of the first rising edge register 201 is coupled to the DQS line 107 (e.g., XDQS) via a first inverter 209 and a second inverter 211, and the latching signal input (CLK) of the first falling edge register 205 is coupled to the DQS line 107 via the first inverter 209. The latching signal input (CLK) of the second rising edge register 203 is coupled to the clock line 109 (e.g., XCLK) via a third inverter 213, and the latching signal input (CLK) of the second falling edge register 207 is coupled to the clock line 109 via the third inverter 213 and a fourth inverter 215.

As previously stated, postamble corruption results when corrupt data is latched into the first falling edge register after the DQS is released (e.g., following the postamble). Accordingly, the operation of the rising edge latching circuit 115 is described herein only as required for understanding the falling edge latching circuit 117's operation.

Figure 4:
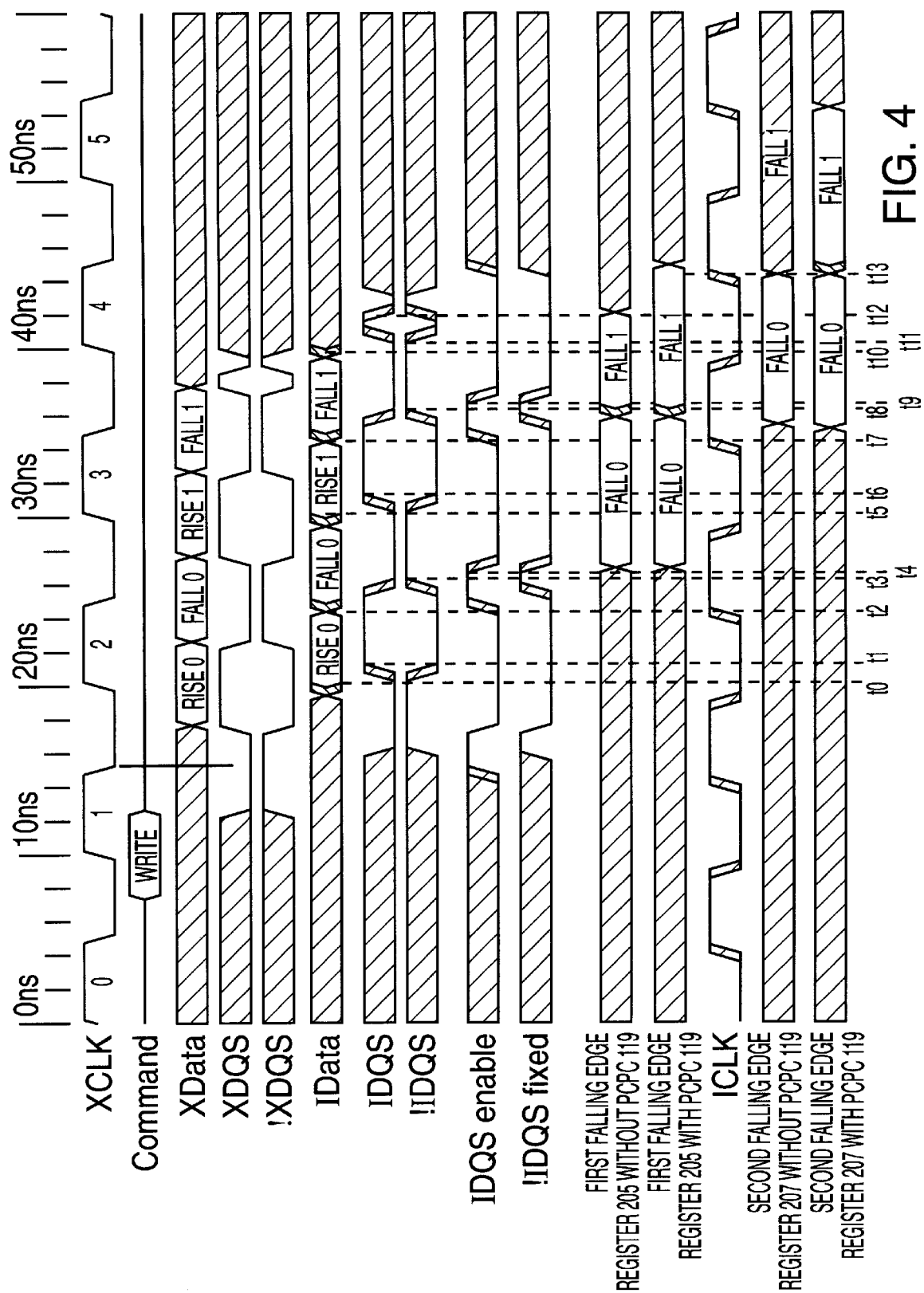
FIG. 4 is a timing diagram of the operation of the falling edge latching circuit of FIG. 1 with and without the inventive postamble corruption protection circuit coupled thereto.

FIG. 4 is a timing diagram of the operation of the falling edge latching circuit 117 of FIG. 1 with and without the postamble corruption protection circuit 119 coupled thereto, and is useful in describing postamble corruption within the falling edge latching circuit 117 of FIG. 2. Specifically, FIG. 4 shows the various signals supplied by the controller chip 105 to the DDR memory chip 103 including the external clock (XCLK) supplied via the clock line 109, the write command (COMMAND) supplied via a control line (not shown), the external data (Xdata) supplied via the data bus 111 and the external DQS (XDQS) supplied via the DQS line 107. These signals, with the exception of COMMAND, also are shown as they are present within the DDR memory chip 103 (e.g., delayed and with a slight uncertainty in rising and falling edge location due to buffering within the DDR memory chip 103 as indicated by the shaded transition regions) as ICLK, Idata and IDQS, respectively. Additionally, XDQS and IDQS are shown inverted as !XDQS and !IDQS. The contents of the first and the second falling edge registers 205, 207 without the postamble corruption protection circuit 119 present are labeled "first falling edge register 205 without PCPC 119" and "second falling edge register 207 without PCPC 119," respectively.

In operation, at time $t_0$, the first rising edge data bit present on the data bus 111 (RISE0) stabilizes within the DDR memory chip 103. At time $t_1$, the IDQS undergoes a rising edge transition, and in response thereto (e.g., via the first rising edge register 201's latching signal input (CLK)), the data bit RISE0 is latched into the first rising edge register 201.

At time $t_2$, the data input to the DDR memory chip 103 from the data bus 111 switches from the data bit RISE0 to the first falling edge data bit (FALL0). At time $t_3$, the IDQS undergoes a falling edge transition so that the !IDQS undergoes a rising edge transition, and, in response thereto, the data bit FALL0 is latched into the first falling edge register 205. At about time $t_4$, the data bit FALL0 has stabilized within the first falling edge register 205.

At time $t_5$, the second rising edge data bit present on the data bus 111 (RISE1) stabilizes within the DDR memory chip 103. At time $t_6$, the IDQS undergoes a rising edge transition, and, in response thereto, the data bit RISE1 is latched into the first rising edge register 201.

At time $t_7$, the ICLK undergoes a rising edge transition, and, in response thereto, the data bit FALL0 is latched into the second falling edge register 207 from the first falling edge register 205. The data bit FALL0 stabilizes within the second falling edge register 207 shortly thereafter.

At time $t_8$, the IDQS undergoes a falling edge transition so that the !IDQS undergoes a rising edge transition, and, in response thereto, the data bit FALL1 is latched into the first falling edge register 205. The postamble also begins at time $t_8$. At time $t_9$, the data bit FALL1 has stabilized within the first falling edge register 205.

At time $t_{10}$, the data provided by the data bus 111 to the DDR memory chip 103 is no longer valid data (i.e., is corrupt data), and at time $t_{11}$ the postamble ends and the IDQS is released. Between times $t_{11}$ and $t_{12}$ the IDQS oscillates, and at time $t_{12}$ the oscillation of the IDQS generates a false IDQS falling edge transition. The false IDQS falling edge transition generates an !IDQS rising edge transition which latches the corrupt data provided by the data bus 111 into the first falling edge register 205.

At time $t_{13}$, the ICLK undergoes a rising edge transition, and, in response thereto, the corrupt data is latched into the second falling edge register 207 from the first falling edge register 205. The corrupt data stabilizes within the second falling edge register 207 shortly thereafter. Accordingly, absent the postamble corruption protection circuit 119 (described below), postamble corruption can result within the DDR memory chip 103. Similar postamble corruption may result within the controller 105 during a read operation if the postamble corruption protection circuit 125 is not present.

Figure 3:
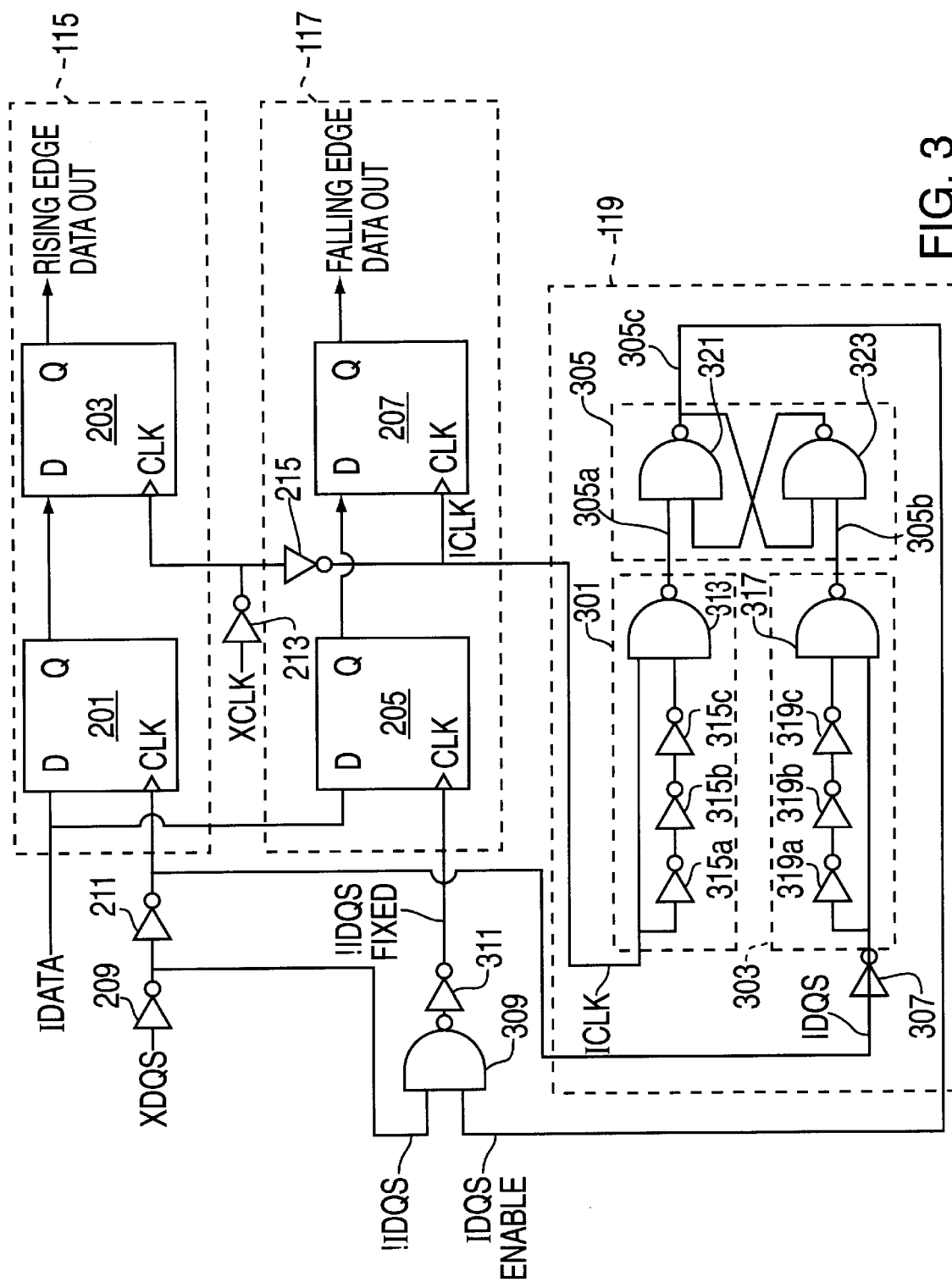
FIG. 3 is a schematic diagram of the rising edge latching circuit and the falling edge latching circuit of the DDR memory chip of FIG. 1 having the inventive postamble corruption protection circuit coupled thereto.

With reference to FIG. 3, the postamble corruption protection circuit 119 is shown coupled to the falling edge latching circuit 117. The rising edge latching circuit 115 is also shown.

The postamble corruption protection circuit 119 comprises a first one shot 301, a second one shot 303 and a set/reset register 305 coupled to the first and the second one shots 301, 303. The first and the second one shots 301, 303 each comprise an input and an output, and the set/reset register 305 comprises a set input 305a, a reset input 305b and an output 305c which serves as an enable signal for the first falling edge register 205 (IDQS Enable).

The input of the first one shot 301 is coupled to the clock line 109 (e.g., XCLK) via the third inverter 213 and the fourth inverter 215, and the output of the first one shot 301 is coupled to the set input 305a of the set/reset register 305. The input of the second one shot 303 is coupled to the DQS line 107 (e.g., XDQS) via the first inverter 209, the second inverter 211 and a fifth inverter 307, and the output of the second one shot 303 is coupled to the reset input 305b of the set/reset register 305.

As previously described, when the postamble corruption protection circuit 119 is absent, the latching signal input (CLK) of the first falling edge register 205 is coupled to the XDQS via the first inverter 209. However, when the postamble corruption protection circuit 119 is present, the latching signal input (CLK) of the first falling edge register 205 is coupled to the output (i.e., !IDQS fixed) of a first NAND gate 309 via a sixth inverter 311. A first input of the first NAND gate 309 is coupled to the XDQS via the first inverter 209, and a second input of the first NAND gate 309 is coupled to the output 305c (IDQS Enable) of the set/reset register 305.

The first and the second one shots 301, 303 may comprise any type of one shot. Preferably the first one shot 301 comprises a second NAND gate 313 having a first input that serves as the input of the first one shot 301, a second input coupled to the first input via a first plurality of inverters 315a–c and an output that serves as the output of the first one shot 301. Similarly, the second one shot 303 preferably comprises a third NAND gate 317 having a first input that serves as the input of the second one shot 303, a second input coupled to the first input via a second plurality of inverters 319a–c and an output that serves as the output of the second one shot 303. Both the first one shot 301 and the second one shot 303 operate identically; namely, when the input to either one shot is switched from a low voltage level to a high voltage level, the output of the one shot pulses low for a time period set by the propagation delay through the plurality of inverters (315a–c or 319a–c) coupled thereto.

The set/reset register 305 may comprise any type of set/reset register. Preferably the set/reset register 305 comprises a fourth NAND gate 321 having a first input, a second input and an output, and a fifth NAND gate 323 having a first input, a second input and an output. The first input of the fourth NAND gate 321 serves as the set input 305a of the set/reset register 305, the second input of the fourth NAND gate 321 is coupled to the output of the fifth NAND gate 323 and the output of the fourth NAND gate 321 serves as the output 305c (IDQS Enable) of the set/reset register 305. The first input of the fifth NAND gate 323 is coupled to the output of the fourth NAND gate 321 and the second input of the fifth NAND gate 323 serves as the reset input 305b of the set/reset register 305.

The operation of the set/reset register 305 is as follows: if the set input 305a is pulsed low (e.g., goes low and then returns high due to a low pulse output from the first one shot 301), a high voltage level is output by the output 305c (e.g., IDQS enable is high) as long as the reset input 305b remains high; and if the reset input 305b is pulsed low (e.g., due to a low pulse output from the second one shot 303), a low voltage level is output by the output 305c (e.g., IDQS enable is low) as long as the set input 305a remains high.

In general, the postamble corruption protection circuit 119 functions so as to disable data latching by the first falling edge register 205 following each falling edge of the IDQS and to enable data latching by the first falling edge register 205 following each ICLK signal that latches data from the first falling edge register 205 to the second falling edge register 207. For instance, in response to an IDQS falling edge, assuming the IDQS enable is high, a data bit from the data bus 111 is latched into the first falling edge register 205. Also in response to the IDQS falling edge, the input of the second one shot 303 experiences a low to high voltage level transition (e.g., due to the fifth inverter 307) which causes the second one shot 303 to output a low voltage pulse to the reset input 305b of the set/reset register 305. In response thereto, the output 305c of the set/reset register 305 outputs a low voltage level so that the IDQS enable is low. The IDQS enable is held low until the set/reset register 305 is set. With the IDQS enable held low, the first falling edge register 205 is effectively disabled from latching additional data from the data bus 111 because the low voltage level on the second input terminal of the first NAND gate 309 holds the output of the sixth inverter 311 low regardless of the voltage state of the DQS.

Thereafter, in response to a rising edge of the ICLK, the data within the first falling edge register 205 is latched into the second falling edge register 207. The low to high voltage level transition of the ICLK also causes the first one shot 301 to output a low voltage pulse to the set input 305a of the set/reset register 305. In response thereto, the output 305c of the set/reset register 305 outputs a high voltage level so that the IDQS enable is high. The IDQS enable is held high until the set/reset register 305 is reset by another IDQS falling edge. With the IDQS enable held high, data latching by the first falling edge register 205 is enabled because the high voltage level on the second input terminal of the first NAND gate 309 allows the output of the sixth inverter 311 to track any voltage transitions of the IDQS.

In summary, data latching by the first falling edge register 205 is disabled after each IDQS falling edge and is enabled after each ICLK transition that latches data from the first falling edge register 205 into the second falling edge register 207. By disabling latching by the first falling edge register 205 following each IDQS falling edge, the postamble corruption protection circuit 119 need not know when the postamble will occur in order to prevent postamble corruption, and data streams of arbitrary length may be transferred free of postamble corruption.

With reference to FIG. 4, the operation of the falling edge latching circuit 117 with the postamble corruption protection circuit 119 coupled thereto (FIG. 3) is described. Only the portions of the timing diagram relevant to understanding the operation of the falling edge latching circuit 117 (with the postamble corruption protection circuit 119) are described. The contents of the first and the second falling edge registers 205, 207 with the postamble corruption protection circuit 119 present are labeled "first falling edge register 205 with PCPC 119" and "second falling edge register 207 with PCPC 119," respectively.

At time $t_2$, the rising edge transition of the ICLK triggers the first one shot 301, which sets the set/reset register 305 shortly thereafter. As the set/reset register 305 is set, the IDQS enable stabilizes at a high voltage level. At time $t_3$, the IDQS undergoes a falling edge transition so that the !IDQS undergoes a rising edge transition. Because the IDQS enable is held at a high voltage level, the voltage at the output of the sixth inverter 311 (!IDQS fixed) tracks !IDQS. The data bit FALL0, therefore, is latched into the first falling edge register 205. Also, the IDQS falling edge triggers the second one shot 303 so as to reset the set/reset register 305. As the set/reset register 305 is reset, the IDQS enable is driven low and in response thereto, the !IDQS fixed is driven low (at time $t_4$). Data latching by the first falling edge register 205 thereby is disabled.

At time $t_7$, the ICLK undergoes a rising edge transition, and, in response thereto, the data bit FALL0 is latched into the second falling edge register 207 from the first falling edge register 205. The ICLK rising edge transition triggers the first one shot 301, which sets the set/reset register 305 shortly thereafter. As the set/reset register 305 is set, the IDQS enable stabilizes at a high voltage level and data latching by the first falling edge register 205 is enabled.

At time $t_8$, the IDQS undergoes a falling edge transition so that the !IDQS undergoes a rising edge transition. With the IDQS enable held high, the !IDQS fixed tracks the !IDQS, and the data bit FALL1 is latched into the first falling edge register 205. Also, the postamble begins, and the IDQS falling edge triggers the second one shot 303 so as to reset the set/reset register 305. The IDQS enable thereby is driven low, and, in response thereto, the !IDQS fixed is driven low (at time $t_9$) and data latching by the first falling edge register 205 is disabled.

At time $t_{10}$, the data provided by the data bus 111 to the DDR memory chip 103 is corrupt, and at time $t_{11}$ the postamble ends and the IDQS is released. Between times $t_{11}$ and $t_{12}$ the IDQS oscillates, and at time $t_{12}$ the oscillation of the IDQS generates a false IDQS falling edge transition and a false !IDQS rising edge transition. However, unlike the first falling edge register 205 without the postamble corruption protection circuit 119, the first falling edge register 205 with the postamble corruption protection circuit 119 is disabled by the low voltage IDQS enable so that the corrupt data provided by the data bus 111 is not latched into the first falling edge register 205.

At time $t_{13}$, the ICLK undergoes a rising edge transition, and, in response thereto, FALL1 is latched into the second falling edge register 207 from the first falling edge register 205. Accordingly, with the postamble corruption protection circuit 119 present, postamble corruption is prevented.

The foregoing description discloses only the preferred embodiments of the invention, modifications of the above disclosed apparatus and method which fall within the scope of the invention will be readily apparent to those of ordinary skill in the art. For instance, while the particular registers and one-shots described herein are preferred, other types may be similarly employed (e.g., NOR logic set/reset latches, NOR logic one-shots, JK-type or D-type latches, etc.).

Accordingly, while the present invention has been disclosed in connection with the preferred embodiments thereof, it should be understood that other embodiments may fall within the spirit and scope of the invention, as defined by the following claims.

The invention claimed is:

1. A digital logic circuit for storing data in a memory system comprising:

a controller circuit;

a data strobe (DQS) generated by the controller circuit having a rising and falling edge;

a first and second register used to capture the data; and a latching signal which is used to latch the data into the first register on the DQS falling edge along with a disable signal, the disable signal remains latched until the second register receives a second latching signal.

2. A digital logic circuit for storing data in a memory system in response to a data strobe (DQS) having a rising and a falling edge, the digital logic circuit comprising:

a falling edge latching circuit having a first and a second register, the first register for latching the data in response to a falling edge of the DQS; and a postamble corruption protection circuit coupled to the falling edge latching circuit for disabling data latching by the first register following a DQS falling edge until the second register receives a second register latching signal.

3. The digital logic circuit of claim 2 wherein the first register comprises a first D-type latch and wherein the second register comprises a second D-type latch.

4. The digital logic circuit of claim 2 wherein the second register latching signal comprises a clock signal.

5. The digital logic circuit of claim 2 wherein the postamble corruption protection circuit comprises:

a first one shot for generating a first output pulse in response to the second register latching signal;

a second one shot for generating a second output pulse in response to a DQS falling edge; and a set/reset register coupled to the first and the second one shots and to the first register, the set/reset register for generating in response to the first output pulse a DQS enable signal having a first logic state, the first logic state enabling data latching by the first register, and for generating in response to the second output pulse a DQS enable signal having a second logic state, the second logic state disabling data latching by the first register.

6. The digital logic circuit of claim 5 wherein the first one shot comprises:

a first plurality of series connected inverters having an input for receiving the second register latching signal and an output; and a first NAND gate having a first input for receiving the second register latching signal, a second input coupled to the output of the first plurality of series connected inverters and an output coupled to the set/reset register.

7. The digital logic circuit of claim 6 wherein the second one shot comprises:

a second plurality of series connected inverters having an input for receiving the DQS and an output; and a second NAND gate having a first input for receiving the DQS, a second input coupled to the output of the second plurality of series connected inverters and an output coupled to the set/reset register.

8. The digital logic circuit of claim 7 wherein the set/reset register comprises:

a third NAND gate having a first input coupled to the output of the first NAND gate, a second input and an output for generating the DQS enable signal; and a fourth NAND gate having a first input coupled to the output of the third NAND gate, a second input coupled to the output of the second NAND gate and an output coupled to the second input of the third NAND gate.

9. The digital logic circuit of claim 8 further comprising a fifth NAND gate having a first input for receiving the DQS, a second input coupled to the output of the third NAND gate for receiving the DQS enable signal, and an output coupled to the first register for latching the data into the first register in response to a falling edge of the DQS when the DQS enable signal is in the first logic state.

10. A memory system comprising:

a controller for generating a write signal, a clock signal and a data strobe (DQS) having a rising and a falling edge; and a memory coupled to controller and comprising the digital logic circuit of claim 4, the memory for receiving the write signal, the clock signal and the DQS and for storing data from the controller in the memory in response to the clock signal and the DQS.

11. A memory system comprising:

a memory for generating a data strobe (DQS) having a rising and a falling edge; and a controller coupled to the memory and comprising the logic circuit of claim 4, the controller for generating a read signal and a clock signal, for receiving the DQS from the memory and for storing data from the memory in the controller in response to the clock signal and the DQS.

12. A digital logic circuit for storing data in a memory system in response to a data strobe (DQS) having a rising and a falling edge, the digital logic circuit comprising:

a falling edge latching means comprising:
       a first latching means for latching the data in response to a falling edge of the DQS; and
       a second latching means coupled to the first latching means for latching the data from the first latching means into the second latching means in response to a second latching means latching signal; and a postamble corruption protection means coupled to the falling edge latching means for disabling data latching by the first latching means following a DQS falling edge until the second latching means receives the second latching means latching signal, the postamble corruption protection means comprising:

a first one shot means for generating a first output pulse in response to the second latching means latching signal;

a second one shot means for generating a second output pulse in response to a DQS falling edge;

a set/reset register means coupled to the first and the second one shot means, the set/reset register for generating in response to the first output pulse a DQS enable signal having a first logic state and for generating in response to the second output pulse a DQS enable signal having a second logic state; and a disable means coupled to the set/reset register means and to the first latching means for enabling data latching by the first latching means when the DQS enable signal is in the first logic state and for disabling data latching by the first latching means when the DQS enable signal is in the second logic state.

13. A method for preventing data corruption during the latching of data within a latching circuit, the latching circuit comprising a first register for latching the data in response to a falling edge of a data strobe (DQS) and a second register for latching the data from the first register into the second register in response to a second register latching signal, the method comprising:

detecting a falling edge of the DQS;

disabling data latching by the first register following the DQS falling edge;

detecting a second register latching signal; and enabling data latching by the first register following the second register latching signal.

14. The method of claim 13 wherein detecting a falling edge of the DQS comprises:

providing a disable one shot for generating a disable pulse in response to a falling edge of the DQS; and generating the disable pulse in response to a falling edge of the DQS via the disable one shot.

15. The method of claim 14 wherein detecting a second register latching signal comprises:

providing an enable one shot for generating an enable pulse in response to the second register latching signal; and generating an enable pulse in response to the second register latching signal via the enable one shot.

16. The method of claim 15 wherein disabling data latching by the first register following the DQS falling edge comprises:

providing a set/reset register for generating in response to the enable pulse a DQS enable signal having a first logic state that enables data latching by the first register and for generating in response to the disable pulse a DQS enable signal having a second logic state that disables data latching by the first register; and generating the DQS enable signal having the second logic state in response to the disable pulse.

17. The method of claim 16 wherein enabling data latching by the first register following the second register latching signal comprises generating the DQS enable signal having the first logic state in response to the enable pulse.

* * * * *